United States Patent [19]

Grasmueller et al.

[11] Patent Number: 5,125,152
[45] Date of Patent: Jun. 30, 1992

[54] ADAPTOR FOR A SUCTION PIPETTE

[75] Inventors: Hans-Horst Grasmueller, Mammendorf; Winfried Hau, Munich, both of Fed. Rep. of Germany

[73] Assignee: Siemens Aktiengesellschaft, Munich, Fed. Rep. of Germany

[21] Appl. No.: 637,609

[22] Filed: Jan. 4, 1991

[30] Foreign Application Priority Data

Jan. 12, 1990 [DE] Fed. Rep. of Germany ....... 4000778

[51] Int. Cl.$^5$ ............................................. H05K 3/30
[52] U.S. Cl. ...................................... 29/740; 29/743; 294/64.1
[58] Field of Search .................... 29/740, 743, 759; 294/64.1

[56] References Cited

U.S. PATENT DOCUMENTS 4,600,228 7/1986 Tarbuck ............................. 294/64.1
5,029,383 7/1991 Snyder et al. ..................... 29/743 X Primary Examiner—Carl E. Hall
Attorney, Agent, or Firm—Hill, Van Santen, Steadman & Simpson

[57] ABSTRACT

An adaptor for a suction pipette of a machine for picking up, transferring and placing components in a desired position characterized by the adaptor having a base member with a socket receiving a movable ball member. The ball member has a surface surrounding a passageway forming a suction surface for engaging the component. The passageway of the ball member is in communication with a passageway of the base member which, in turn, is in communication with the pipette so that a suction is applied therebetween and the ball member is movable to provide a tilting of the suction surface until a component is engaged thereon, at which time atmospheric pressure acting on the ball member will force the ball member into the socket to hold the member in its selected position.

5 Claims, 1 Drawing Sheet

ADAPTOR FOR A SUCTION PIPETTE

BACKGROUND OF THE INVENTION

The present invention is directed to an adaptor with a suction surface for a suction pipette which adaptor will adapt the size of the suction surface to a size of an electronic component to be picked up by the suction pipette and deposited on an assembly surface. The suction pipette and adaptor are particularly useful in an employment in an SMD-automatic equipping machine for surface mounting of components on a printed circuit board.

In SMD-technology (surface mounted device), electrical components are picked up and transported by an automatic equipping machine, which utilizes a vacuum suction pipette. The components are then set down for assembly on a printed circuit board. For the equipping of large components, correspondingly large adaptors with correspondingly large retaining forces are required. Given an unmodified size of the suction pipette, a so-called assembly adaptor is employed therefor. These adaptors, which are generally automatically exchanged by the equipping head, adapt the suction pipette attached thereto to various body surfaces of the different electronic components. In the ideal case, it has been proven that the axis of the suction pipette should extend orthogonally to the surface of the pc board which is to be equipped. This surface is referred to as an assembly surface. Since the presently known and employed adaptors establish a rigid connection between the adaptor and the pipette, the plane of the suction surface is not variable in the handling of a larger electronic component and results in various problems.

If, in the case of an acceptance of an electronic component by a suction pipette with an attached adaptor, the end face of the adaptor, which forms the suction surface, is not adjusted to extend in a parallel direction relative to the surface of the components, errors in the pick up may occur. This is due to the fact that any angle between the suction surface and the surface component provides a gap through which air can be sucked so that the component is not sucked-up at all or, possibly, is attached to the adaptor in a crooked or misaligned fashion.

Once a suction pipette with an adaptor has picked up the component, the next important step is the adjustment of the plane of the connecting legs of the component relative to the surface of the pc board which is to be equipped. If the plane of the end of the legs and the plane of the surface to be equipped are not parallel, an uncontrolled movement may result when the component is set down, for example causing a distortion in the position of the component on the board due to slippage.

One possibility to determine the position of the component, which is held on the suction pipette, is to place the component between the pick-up step and the placing step on a measuring plane and to measure the difference between the plane of the ends of the legs and the measuring plane. The measuring plane, in this case, will extend parallel to the pc board's assembly surface so that the situation can be simulated when the assembly is done. If, however, the component is tilted relative to the measuring plane, a false measurement can result.

SUMMARY OF THE INVENTION

An object of the present invention is to provide an adaptor for a suction pipette, wherein the alignment of the suction surface can be adjusted in a variable fashion relative to the axis of the suction pipette and according to the geometric dimensions of the component and wherein the adjusted position can be held or maintained.

To accomplish these goals, the present invention is directed to an improvement in an adaptor for a suction pipette, said adaptor being attached to a low end of the suction pipette and providing a suction surface facing an electronic component to be picked up, said suction surface corresponding to the size of the electronic component, said adaptor and pipette being used to pick up said electrical component and to place it on an assembly surface on which the component is to be placed. The improvements comprise the adaptor being formed by a base member that can be firmly connected to the suction pipette, a movable member having said suction surface and means for mounting the movable member for movement on the base member to enable tilting the plane of the suction surface relative to the axis of the pipette and including means for holding the movable member in a selected position so that said plane of the suction surface is in the desired angle relative to the axis of the pipette.

The invention is based on the perception that the division of the adaptor into a base part, which can be rigidly connected to the suction pipette, and into a movable part that is fastened to the base member can be moved relative to it and can be held in any desired position relative to the base member, will eliminate errors in the pick-up, the transport, the measuring and the placing of components in automatic equipping machines. The cause for such errors, namely, are the non-parallel alignment of the suction surface of the adaptor, the component surface, the plane of the connecting legs, as well as a possibly present measuring plane in connection with the axis of the suction pipette, which are not adjusted to extend orthogonally to each of these planes and cannot be adjusted to provide a possibility of a variable adjustment of the planes to the suction surface. As soon as the suction pipette with the adaptor touches the component, the body of the movable member of the adaptor is movable at this moment and can dislocate itself relative to the base member so that the suction surface seats itself accurately on the component. With the adaptor held in this position, the component is picked up in a reliable fashion.

In order to preserve the vacuum of the suction pipette via the adaptor to the suction area, it is necessary that the two parts or members of the adaptor, which are mutually movable relative to each other, are held in a position so that they seal off at least approximately gas-tight a suction line extending therethrough. This has the advantage that for the holding event, simultaneously, the vacuum of the suction pipette can be used.

A special embodiment of the invention provides that under the effect of the force generated by the vacuum, which represents itself as a pressing force of the movable member onto the base member, a frictional engagement between these two members will create the mutual holding of the members in the desired position.

For the generation of the frictional engagement, it is not necessary to establish a large area of contact between both members of the adaptor. It is even advantageous to merely provide an all-around annular ring contact surface which, however, generates a complete seal.

In the event the suction pipette or the equipping head is equipped with mechanical clamps, it would be advantageous to employ these for a mechanical clamping of the movable member for the step of holding. The mechanical clamping, however, can also occur via a separate component.

A particularly advantageous embodiment provides that the base member and the movable member are connected to each other in the form of a ball-and-socket joint. Since the entire construction of the ball-and-socket joint is structured to be approximately radially-symmetrical fashion, this provides an advantage that the adjustment corresponding to a tilt or angle can be uniformly obtained in every direction.

In order to avoid impediments when picking up a component, due to a too-large tilt angle, it is advantageous to place the suction surface at a sufficient distance to the center of the ball-and-socket joint by employing an intermediate suction pipe connection.

Another advantageous embodiment provides the employment of a plastic moldable mass, which is placed between the base member and the movable member. When the movable member is moved, this mass will generate a little resistance as possible. Due to the design of the mass in the form so that it is basically plastically moldable, it will ensure that the holding of the parts will not be effected by any forces which were generated by the mass during the adjustment between the base member and the movable member.

The employment of the plastically modable mass, whose viscosity can be influenced from the outside, offers significant advantages, since this portion regarding the plastic or elastic moldability of the mass can be controlled. When a suction is finally applied, due to engaging the surface of the component, this causes the movable member to be pressed against the moldable mass to cause an increase in the frictional holding force to hold the movable member in its position relative to the base member.

Other advantages and features of the invention will be readily apparent from the following description of the preferred embodiments, the drawings and claims.

DESCRIPTION OF THE PREFERRED EMBODIMENTS

Figure 1:
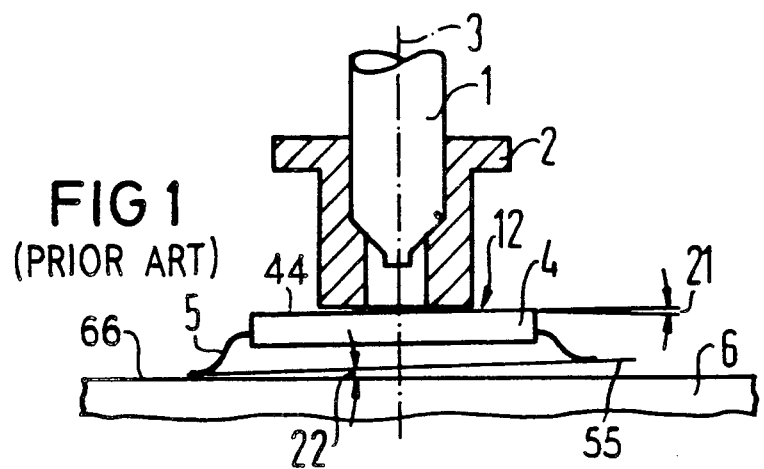
FIG. 1 is a cross sectional view with portions in elevation of a prior art adaptor rigidly mounted on a suction pipette.

A known automatic equipment machine has a suction pipette 1 (FIG. 1), with a rigid adaptor 2 attached to a lower end. The adaptor 2, on an end facing a component 4, has a suction surface 12 which is formed as a plane extending substantially perpendicular to an axis 3 of the pipette 1. With ideal conditions, the adaptor 2 will engage a surface 44 of the component 4 with the suction surface 12 and transport the component 4 with its connecting legs 5 for placement on a surface 66 of a member, such as a printed circuit board 6. However, frequently the axis 3 of the suction pipette 1 does not extend orthogonally relative to the surface 44 of the component and, thus, an angle 21 will develop between the suction surface 12 and the component surface 44. In addition, the lower ends of the connecting legs 5 of the component will constitute a plane 55, which ideally should be aligned to extend parallel to the surface 66. However, inaccuracies may occur and, therefore, the plane 55 will form an angle 22 with the surface 66. The shape of the adaptor and the adjustment of the equipment head on which the suction pipette 1 is attached are, thus, cause for an erroneous adjustment corresponding to the angle 21. In addition, the angle 22 is dependent on an uneven form of the component and can magnify the problems mentioned hereinabove with regard to the proper placement of the component on the assembly surface 66.

Figure 2:
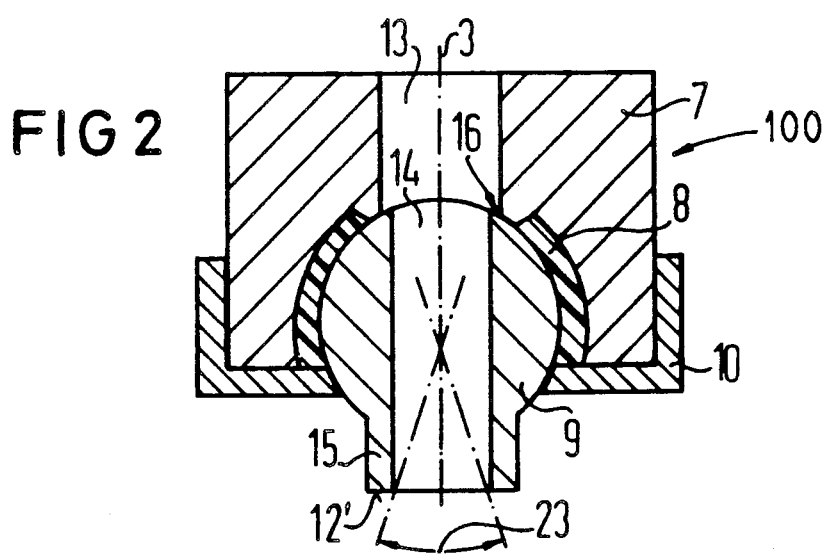
FIG. 2 is a cross sectional view of the adaptor of the present invention having a plastically moldable mass interposed between a base member and the movable member.

The principles of the present invention are particularly useful when incorporated in an adaptor, generally indicated at 100 in FIG. 2, which includes a base member 7 and a movable member 9, which are held together with a ball-and-socket-type joint. The base member 7 is fastened via a clamp seat on a suction pipette 1 and contains an axial bore or passage 13 extending along the axis 3. The movable member 9 also has a bore or passage 14 in which the vacuum will be guided to a suction surface 12'. As illustrated, the adjustable member 9 has a pipe-like extension 15 extending from the ball-shaped portion so that the suction surface 12' can engage a component as the base member 7 and the majority of the adaptor 100 are spaced therefrom. As illustrated, the member 9 is connected by means of a mounting 10 in a movable fashion with regard to the base member 7. The mounting 10 can be attached to the base member in a known manner, for example by being threaded thereon. Essentially, the movable member 9 is freely movable relative to the base member 7, as long as no component is being held on the suction surface 12', or as long as no vacuum exists between the plane formed by the suction surface 12'. In the event that an evacuation is performed via the passage 13 through the suction pipette, given a simultaneous presence of a component 4, a pressing force, which is generated due to the outside atmospheric pressure, will be applied on the member 9 and will press the member 9 against the base member 7. In the embodiment of FIG. 2, an annular or ring-like contact surface 16 surrounds the passage or bore 13 and forms a contact surface which is sufficiently gas-tight for practical employment. The version shown here contains the annular ring 16 and at the same time is provided with an interlocated plastically moldable mass 8. It is possible to provide two versions, one using only the moldable mass 8 and the other utilizing only the annular contact surface 16.

The plastic moldable mass 8, likewise, allows free mobility of the movable member 9, as long as no pressing force is generated. When the position of the movable member 9 is adapted to a component 4 to enable the pick-up at a corresponding tilt angle 23, no forces whatsoever are generated which could occur due to the plastic shaping of the viscous mass. When the adaptor is placed on the component, the movable member is then pressed either against the ring 16 or against the plastically moldable mass 8 to cause a holding of the member 9 in this position, due to the pressing forces generated at this point in time by the vacuum. The member 9 is thereby pressed into the plastically moldable mass 8 so that a frictional engagement will develop, in this case just like a frictional engagement on the annular contact surface 16. In the event that the viscosity of the plastically moldable mass 8 can be influenced from the outside, particular advantages will occur regarding the designated control of the plastic portions of the mass in proportion to the elastic one.

The holding of the movable member 9 relative to the base member 7 is also possible by means of a collet chuck or by means of a magnetic coupling. The collet chuck would effect the holding directly, whereas the magnetic coupling would function, likewise, by means of a frictional engagement between the member 9 and the base member 7.

As a rule, the holding of the adaptor occurs when it is first placed on the component. If necessary, a post-adjustment of the movable member 9 can occur via a short-term interruption of the vacuum, for example when the component is placed on a measuring plane or surface of a test station. Following this, the position of the vacuum would immediately be reestablished to cause a continued holding of the two members in their adjusted position.

Figure 3:
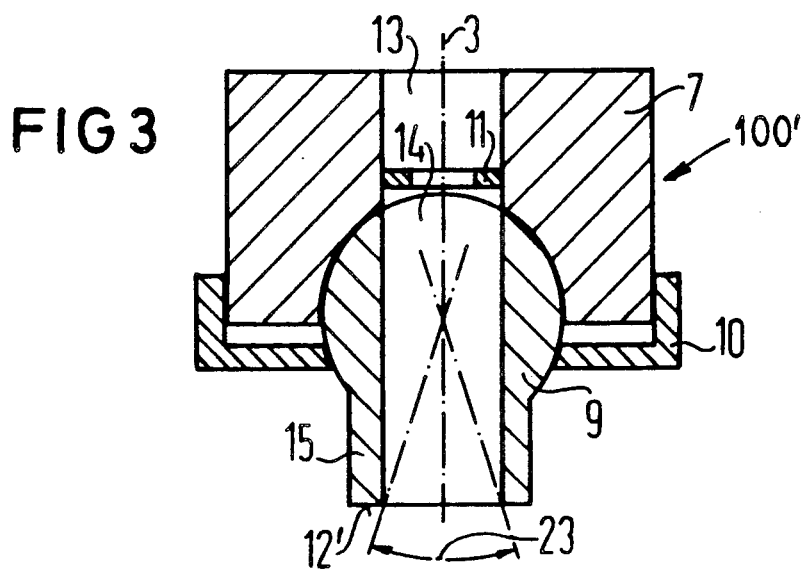
FIG. 3 is a cross sectional view similar to FIG. 2 of a modification of the adaptor of the present invention.

An embodiment of the adaptor is generally indicated at 100' in FIG. 3. In this embodiment, the movable member 9 and the base member 7 are provided and have a ball-and-socket-type joint therebetween, however, the entire contact area between the two members of the adaptor is a large area. In the event that a pressure force is generated due to the vacuum, sufficient friction occurs between the surfaces of the two members to provide the holding of the members in the desired or selected position. It is also conceivable that the contact between the member 9 and the base member 7 can occur via an annular ring or contact surface 16.

In the embodiment 100', a flow resistance ring 11 is provided in the passage 13 to compensate for the drawn-in flow resistance in the passage 14. For example, when the passage 14 is relatively small, it would provide a flow resistance in itself. This would be disadvantageous insofar as the actual movable member 9 would already be sucked on, due to the presence of the flow resistance in the passage 14. Since a generation of the vacuum is provided with a suction is only to occur when the adaptor is in place on the component 4, one must insure that before engaging the component, no frictional engagement and correspondingly no pressure forces will occur between the member 9 and the base member 7. Thus, the restrictor ring 11 insures that these forces do not occur before engagement with a component, such as 4.

Although various minor modifications may be suggested by those versed in the art, it should be understood that we wish to embody within the scope of the patent granted hereon all such modifications as reasonably and properly come within the scope of our contribution to the art.

We claim:

1. In an adaptor for a suction pipette, said adaptor being attached to a lower end of the suction pipette and being provided with a suction surface of a size corresponding to a size of an electrical component which is to be picked up and placed by the suction pipette, the improvements comprising said adaptor being formed by a base member being connectible to the suction pipette and a movable member having the suction surface, means for connecting the movable member to the base member to allow adjustment of a tilt of a plane of the suction surface and holding the movable member in any selected position on said base member, said means including the base member and the movable member being interconnected together by coating surfaces of a socket portion and a ball portion to form a ball-and-socket joint and a layer of a plastic moldable mass being placed between the ball portion and the socket portion.

2. In an adaptor according to claim 1, wherein said movable member has the ball portion and is provided with a pipe-like extension extending from the ball portion along the axis of a passage therein so that the suction surface is spaced from the center of the ball portion.

3. In an adaptor for a suction pipette, said adaptor being attached to a lower end of the suction pipette and being provided with a suction surface of a size corresponding to a size of an electrical component which is to be picked up and placed by the suction pipette, the improvements comprising said adaptor being formed by a base member being connectible to the suction pipette and a movable member having the suction surface, means for connecting the movable member to the base member to allow adjustment of a tilt of a plane of the suction surface and holding the movable member in any selected position on said base member, said means including the base member and the movable member being interconnected together by coacting surface of a socket portion and a ball portion to form a ball-and-socket joint and a layer of a plastically moldable mass being placed between the ball portion and the socket portion, and the viscosity of the plastically moldable mass being influenced from the outside and acts to increase the friction between the ball portion and the socket portion in response to atmospheric pressure acting on the movable member as the suction surface engages a component.

4. In an adaptor according to claim 3, wherein said movable member has the ball portion and is provided with a pipe-like extension from the ball portion along the axis of a passage therein so that the suction surface is spaced from the center of the ball portion.

5. An adaptor for a suction pipette of an equipping machine used to pick up electronic components, transfer them and place them on an assembly surface, said adaptor comprising a base member connectible to the suction pipette, said base member having a socket-like portion and a passage extending therethrough and engaged with a passage of the pipette, a movable member having a ball-like portion and being mounted on the base member with the ball-like portion being received in the socket-like portion and having a passage extending from a junction with the passageway of the base member to a suction surface, and means enabling movement of the movable member to a desired position when a component is engaged on the suction surface, said means including an elastically moldable member interposed between the socket portion and the ball portion, said elastically moldable member enabling movement of the movable member until a component is engaged on the suction surface.

* * * * *